United States Patent [19]
Naiki et al.

[11] Patent Number: 6,075,723
[45] Date of Patent: Jun. 13, 2000

[54] NONVOLATILE SEMICONDUCTOR MEMORY DEVICE AND IC MEMORY CARD USING SAME

[75] Inventors: Ihachi Naiki; Masanori Noda; Tooru Adachi, all of Kanagawa, Japan

[73] Assignee: Sony Corporation, Tokyo, Japan

[21] Appl. No.: 09/210,615

[22] Filed: Dec. 14, 1998

[30] Foreign Application Priority Data

Dec. 15, 1997 [JP] Japan .................................. 9-345365

[51] Int. Cl.⁷ .................................................. G11C 16/04
[52] U.S. Cl. .............................. 365/185.03; 365/185.01; 365/185.29; 365/185.33
[58] Field of Search ...................... 365/189.01, 230.01, 365/185.01, 185.33, 185.29, 185.03

[56] References Cited

U.S. PATENT DOCUMENTS

| | | | |
|---|---|---|---|
| 5,594,691 | 1/1997 | Bashir | 365/189.09 |
| 5,815,443 | 9/1998 | Sweha et al. | 365/189.05 |
| 5,828,616 | 10/1998 | Bauer et al. | 365/210 |
| 5,901,299 | 5/1999 | Anmilli et al. | 395/308 |

OTHER PUBLICATIONS

M. Bauer, R. Alexis, et al.; A Multilevel–Cell 32MB Flash Memory; pp. 132–133; 1995 IEEE International Solid–State Circutis Conference.

*Primary Examiner*—Viet Q. Nguyen
*Attorney, Agent, or Firm*—Ronald P. Kananen; Rader, Fishman & Grauer

[57] ABSTRACT

A nonvolatile semiconductor memory device capable of being changed in method of use according to its application and in addition having a high reliability and an IC memory card using the same. An IC memory card is provided with multi-level type flash memory chips and a controller as principal constituent elements and constituted so as to allow free selection of plurality of operation modes according to the application, that is, use where a storage capacity is large, but there is a reduction in the write/erase speed or the guaranteed number of the repeated rewrites or use where the storage capacity is small, but there is no reduction in the write/erase speed or the guaranteed number of the repeated rewrites.

27 Claims, 12 Drawing Sheets

FIG. 2A
ENTIRE DATA STORAGE REGION OF FLASH MEMORY CARD
| LP MODE |
|---|
FIG. 2B
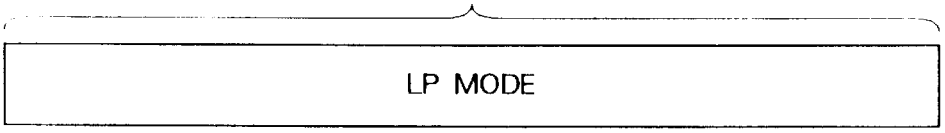
FIG. 3A
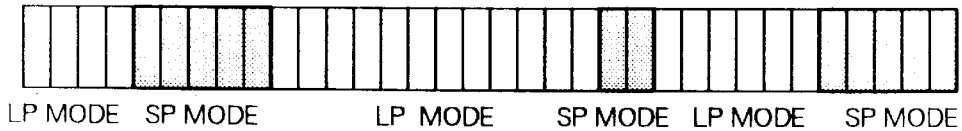
LP MODE  SP MODE    LP MODE    SP MODE  LP MODE  SP MODE
FIG. 3B
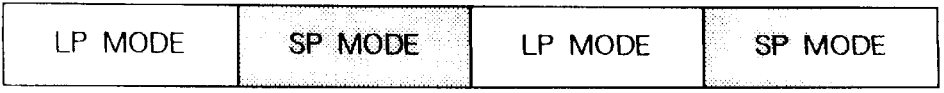

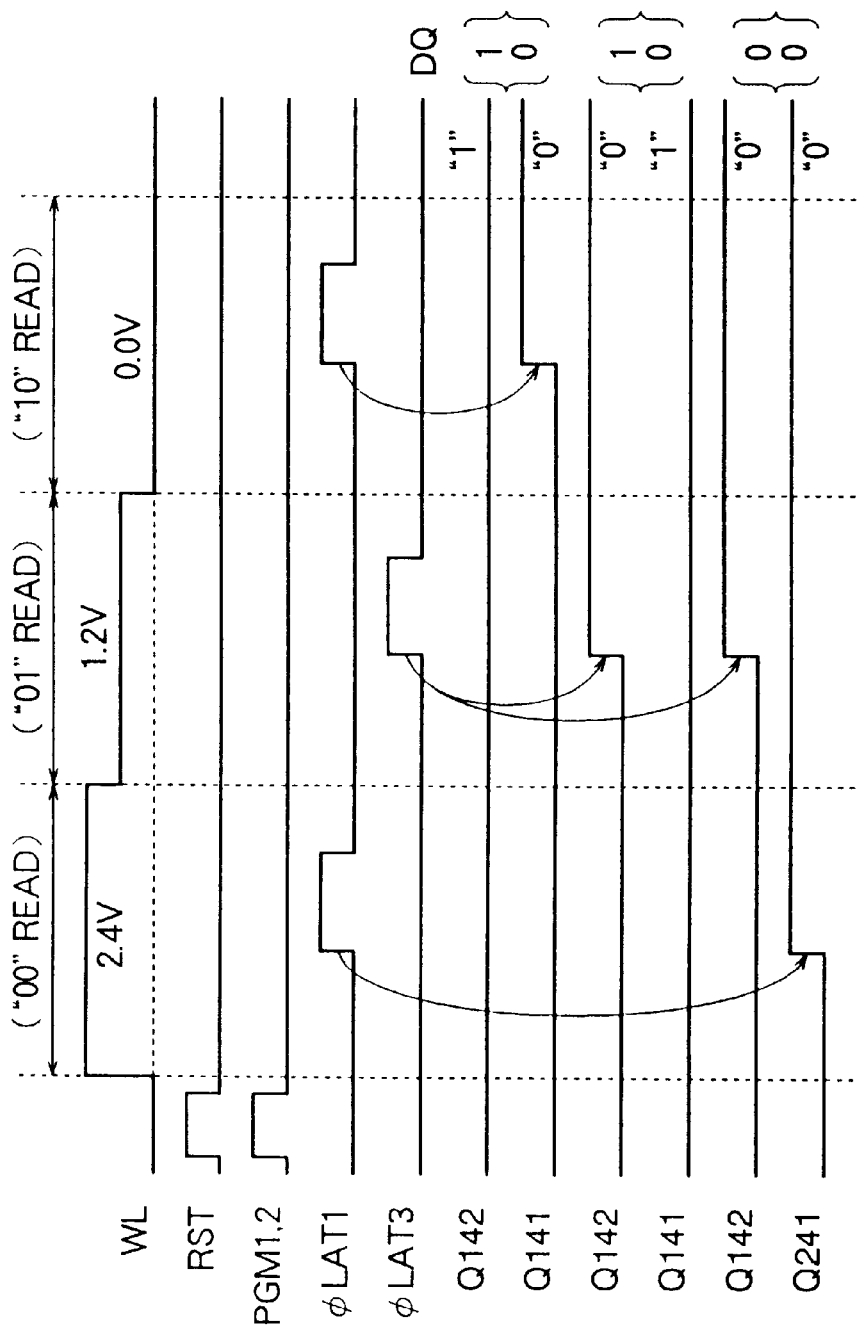

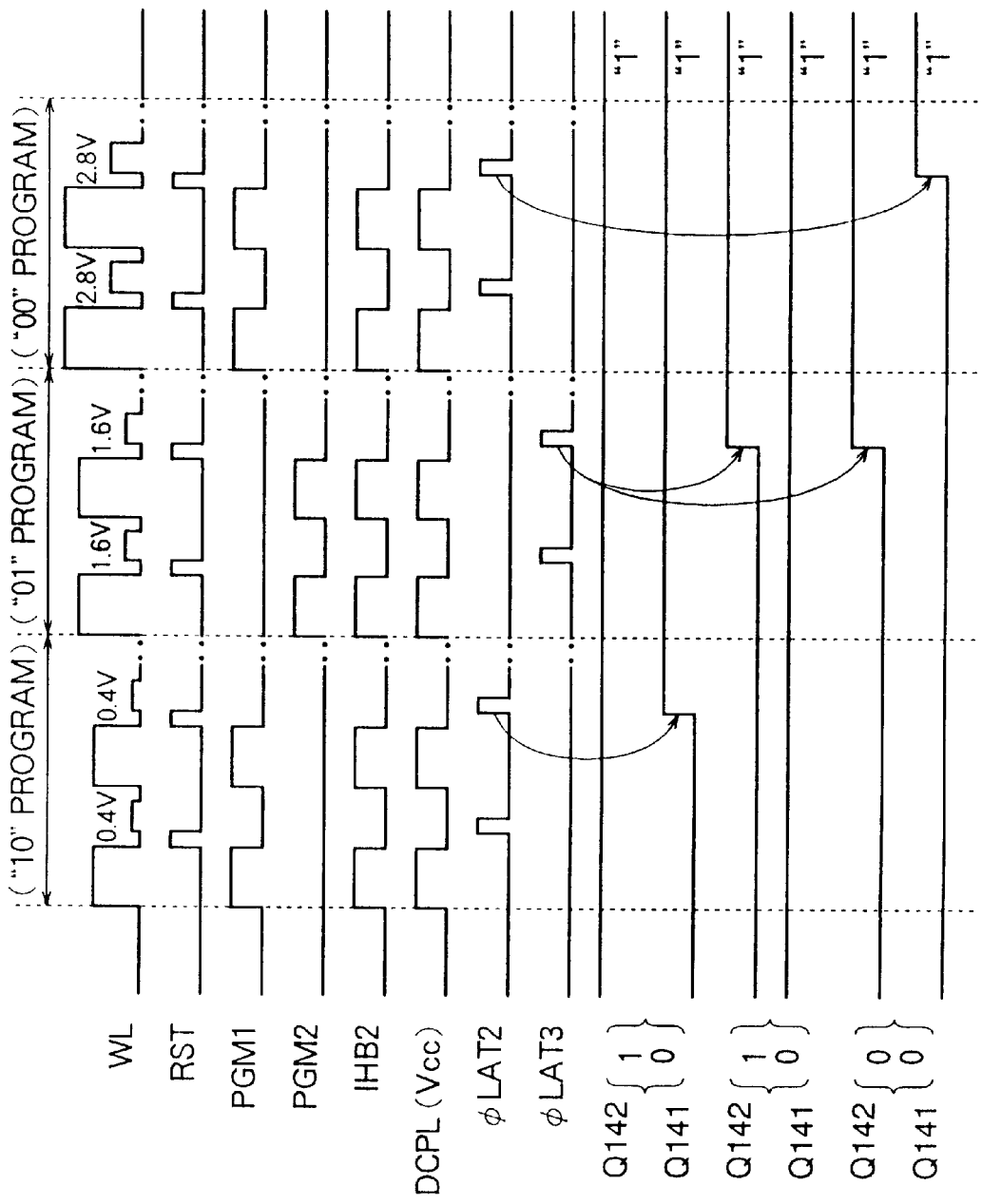

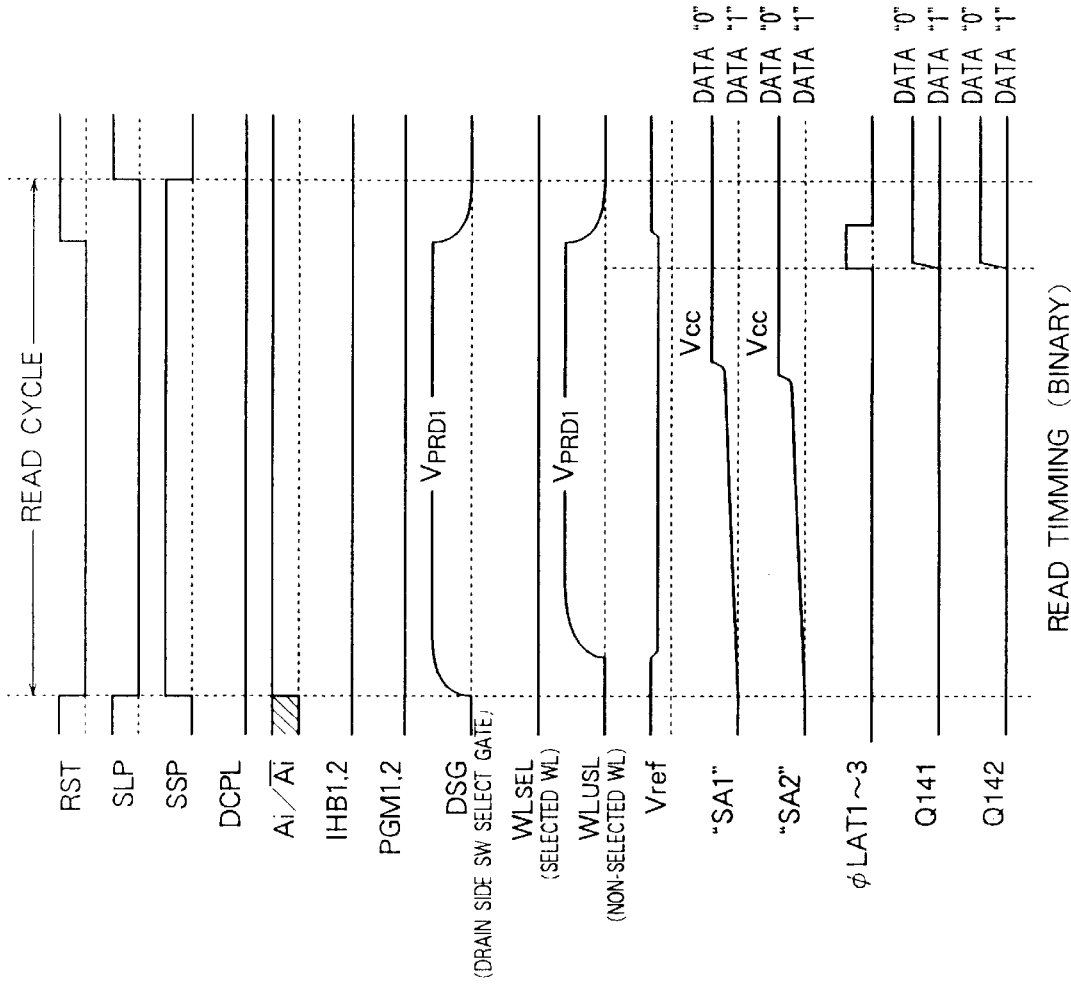

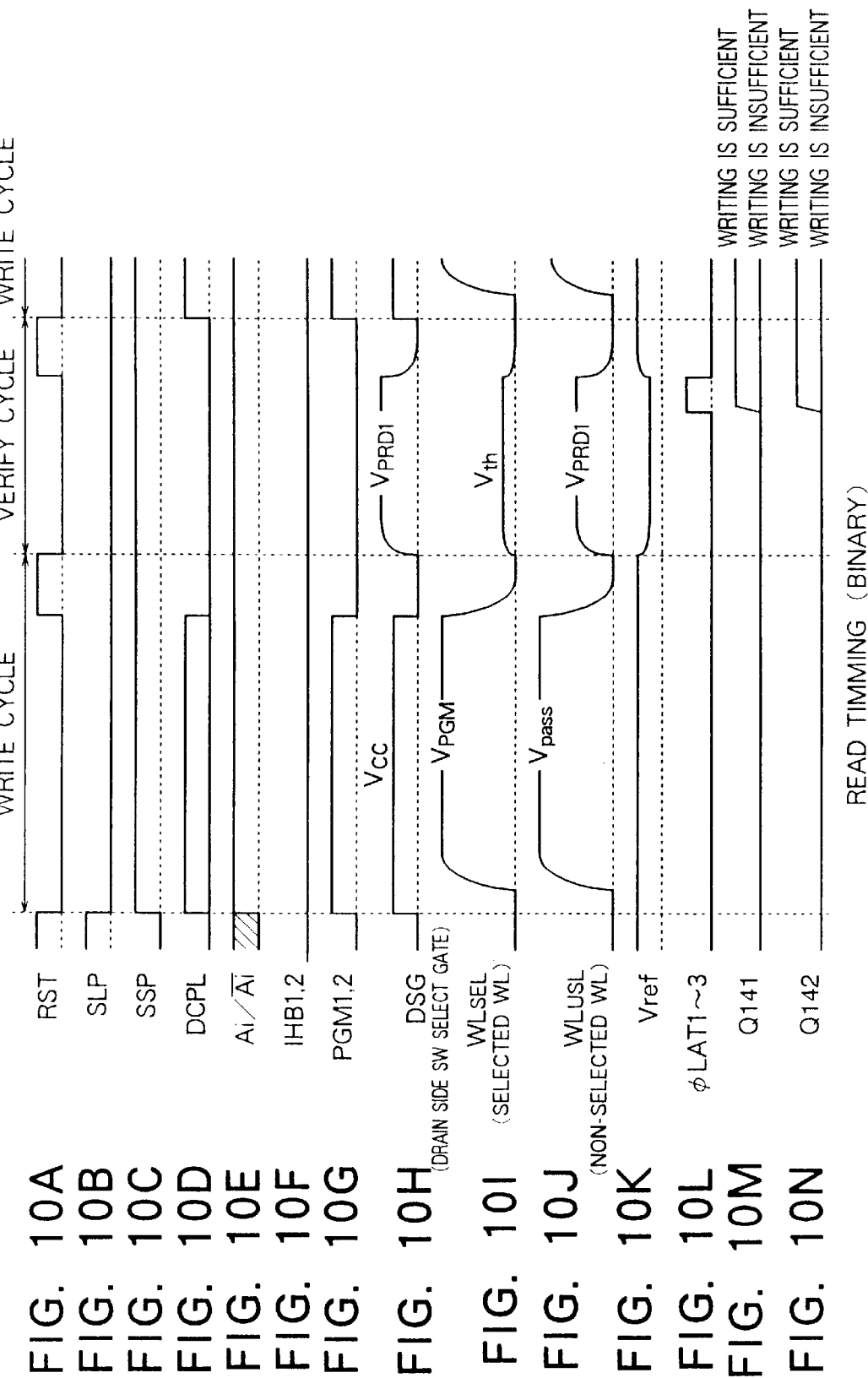

NONVOLATILE SEMICONDUCTOR MEMORY DEVICE AND IC MEMORY CARD USING SAME

BACKGROUND OF THE INVENTION

1. Field of the Invention

The present invention relates to a nonvolatile semiconductor memory device capable of storing binary or trinary or more data in a memory cell and to an IC memory card using the same.

2. Description of the Related Art

In a nonvolatile semiconductor memory device such as a flash memory, a binary type memory cell structure for storing data taking two values of "b 0" and "1" in one memory cell transistor is usual.

Along with the recent demands for increasing the capacity of semiconductor memory devices, a so-called multi-level type nonvolatile semiconductor memory device for storing trinary or more data in one memory cell transistor has been proposed (refer to for example "A Multi-Level 32 Mb Memory" '95 *ISSCC* P132 on).

A nonvolatile semiconductor memory device capable of storing multi-level data, including binary data, in this way is generally used as a so-called data storage.

As data storage use flash memories, large capacity memories such as 64 Mbit NAND type flash memories have recently started to appear. Along with this, the market for large capacity products such as digital still cameras is now becoming more active.

Further, an integrated circuit (IC) memory card using a flash memory as a storage medium has been proposed and put onto the market and is being used as part of digital still cameras.

While flash memory cards have been used for the storing of still images in digital still cameras in recent years, its use is expected to spread also to recording of music and storing of moving pictures in the future.

An increase of the capacity of a flash memory card in principle requires an increase of the capacity of a flash memory chip, but an increase of the capacity of a flash memory can also be realized by achieving making the memory cells multi-level for storing a plurality of data (bits) in one memory cell in addition to scaling of the semiconductor.

In general, making memory cells multi-level increases the memory capacity, but also causes a reduction in the write speed and read speed and a reduction in the guaranteed number of repeated rewrites.

Namely, in a flash memory card using such a multi-level flash memory, there is a reduction in the write and read speeds and a reduction in the guaranteed number of repeated rewrites compared with a flash memory card using a non-multi-level flash memory.

In information apparatuses such as portable PCs and portable data terminals, the number of repeated rewrites into the flash memory card used in these apparatuses is large, so use of a flash memory card mounting a non-multi-level flash memory is most suitable.

The guaranteed number of repeated rewrites is about 100,000.

However, in general consumer apparatuses, in particular audio video (AV) apparatuses for storing stationary images, music, and moving pictures, the number of repeated rewrites of the data into the flash memory card is small so it is expected that flash memory cards mounting multi-level flash memories will be used.

The guaranteed number of repeated rewrites is less than 10,000 in this case.

Note however that the storage capacity of the card becomes larger, that is, the unit price of a byte becomes lower, in a flash memory card mounting a multi-level flash memory in comparison with a flash memory card mounting a non-multi-level flash memory.

As described above, therefore, a flash memory card mounting a multi-level flash memory is well suited for use for general consumer electronics.

In this way, it is projected that different types of flash memory cards will be used for different applications, that is, one type for products requiring flash memory cards having a fast write and read speed and a large guaranteed number of repeated rewrites and another type for products requiring flash memory cards having a slow write and read speed and a small number of repeated rewrites.

Accordingly, users will have to take the trouble of selecting which product he or she needs limited depending on his or her purpose.

Further, it will be necessary in order to develop specialized flash memory cards, specialized flash memory chips, and specialized controllers for controlling the same for each type of flash memory.

SUMMARY OF THE INVENTION

The present invention was made in consideration with such a circumstance and has as an object thereof to provide a nonvolatile semiconductor memory device capable of being changed in the method of use according to the application and in addition having a high reliability and an IC memory card using the same.

To attain the above object, according to a first aspect of the present invention, there is provided a nonvolatile semiconductor memory device having a memory array region in which a plurality of memory cell transistors capable of storing binary or trinary or more multi-level data are arranged, the nonvolatile semiconductor memory device further having a means capable of storing data by changing a storage capacity of at least part of the region of the memory array region.

Preferably, the means capable of changing the storage capacity changes the storage capacity in accordance with an external signal.

According to a second aspect of the present invention, there is provided a nonvolatile semiconductor memory device having a memory array region in which a plurality of memory cell transistors capable of storing binary or trinary or more multi-level data are arranged, the nonvolatile semiconductor memory device further having a means capable of storing data by changing the storage capacity by changing the number of levels of the multi-level data to be stored in at least part of the region of the memory array region.

Preferably, the means capable of changing the number of levels of the multi-level data changes the number of levels of the multi-level data in accordance with an operation mode signal from the outside.

More preferably the operation modes comprise a first mode having a large storage capacity and a second mode having a small storage capacity; and the means capable of changing the number of levels of the multi-level data sets the number of levels of the multi-level data at the first mode higher than the number of levels of the multi-level data at the second mode.

Alternatively, preferably, the means capable of changing the number of levels of the multi-level data is capable of changing the maximum storage capacity in accordance with an operation mode signal from the outside and changes the number of levels of the multi-level data in accordance with that maximum storage capacity.

Alternatively, preferably, further provision is made of a counter for counting the number of repeated write/erase operations in a mode of storage capacity of at least one among a plurality of operation modes.

More preferably, the means capable of changing the number of levels of the multi-level data changes the number of levels of the multi-level data to a low setting so that the maximum storage capacity of at least one of the storage regions becomes small when the counter exceeds the guaranteed number of repeated rewrites in that mode.

According to a third aspect of the present invention, there is provided a nonvolatile semiconductor memory device having a memory array region in which a plurality of memory cell transistors capable of storing binary or trinary or more multi-level data are arranged, the nonvolatile semiconductor memory device further having a means capable of storing data by changing the storage capacity by changing the number of levels of the multi-level data to be stored in at least part of the region of the memory array region, the means capable of changing the number of levels of the multi-level data performing the change in write/erase units, that is, blocks, when changing the storage capacity for parts of the storage region.

Preferably, the device performs the writing and reading of data in units of pages.

More preferably, the semiconductor memory device of the present invention further comprises a means for making the plurality of rows to be accessed when the number of levels of the multi-level data is high one page when setting the number of levels of the multi-level data low so that the page size is held constant even if changing the number of levels of the multi-level data.

Alternatively, preferably, the semiconductor memory device of the present invention further comprises a counter for counting the number of repeated write/erase operations in a mode of storage capacity of at least one among a plurality of operation modes.

More preferably, the means capable of changing the number of levels of the multi-level data changes the number of levels of the multi-level data to a low setting so that the maximum storage capacity of at least one of the storage regions becomes small when the counter exceeds the guaranteed number of repeated rewrites in that mode.

Still more preferably, the semiconductor memory device of the present invention further comprises a means for informing the outside that there has been a change when changing the number of levels of the multi-level data to a low setting so that the maximum storage capacity becomes small.

According to a fourth aspect of the present invention, there is provided an IC memory card capable of storing/reproducing data with an external apparatus having the nonvolatile semiconductor memory device of the above aspects of the invention.

Preferably, a characteristic portion is formed for setting the storage capacity in the card, the external apparatus discriminates the storage capacity in accordance with the characteristic portion of the card, and the means capable of changing the storage capacity changes the storage capacity in accordance with a signal from the external apparatus.

Note that, the characteristic portion of the IC memory card includes a portion enabling a change of the storage capacity by changing the mode of the maximum storage capacity by an electric switch and portions enabling discrimination of the storage capacity by a position or size of a notch in the card or a position and a size of a circular shape in the card or by a slide switch which a user can freely set.

When changing the maximum storage capacity, the number of levels of the multi-level data of the flash memory mounted in the card is changed in accordance with the maximum storage capacity thereof.

Further, when changing the storage capacity for parts of the storage region, the mode is set in write/erase units of the memory, that is, blocks, as the smallest units of the change. Also, a function is provided for making a plurality of pages one page so that the page size (for example, 512 bytes) does not change when changing the storage capacity.

Further, the counter counts the number of repeated write/erase operations in at least one mode of storage capacity and stores the number. When the number exceeds the guaranteed number of repeated rewrites in that mode, it sends a signal to the external apparatus. After this, all or part of the memory set in that mode is used reducing the maximum storage capacity.

BRIEF DESCRIPTION OF THE DRAWINGS

The above object and features of the present invention will be more apparent from the following description of the preferred embodiments given with reference to the accompanying drawings, wherein:

FIGS. 2A and 2B are views for explaining an aspect of setting an entire data storage region of the IC memory card to an LP mode or an SP mode;

FIGS. 3A and 3B are views for explaining an aspect for setting the LP mode or the SP mode for parts of the storage region of the IC memory card;

FIGS. 7A to 7K are timing charts for explaining an operation at the time of reading 4-level data in the circuit of FIG. 6;

FIGS. 8A to 8N are timing charts for explaining the operation at the time of programming 4-level data in the circuit of FIG. 6;

FIGS. 9A to 9P are timing charts for explaining the operation at the time of reading binary data in the circuit of FIG. 6;

FIGS. 10A to 10N are timing charts for explaining the operation at the time of programming binary data in the circuit of FIG. 6;

DESCRIPTION OF THE PREFERRED EMBODIMENTS

Below, preferred embodiments of the present invention will be explained with reference to the drawings.

Figure 1:
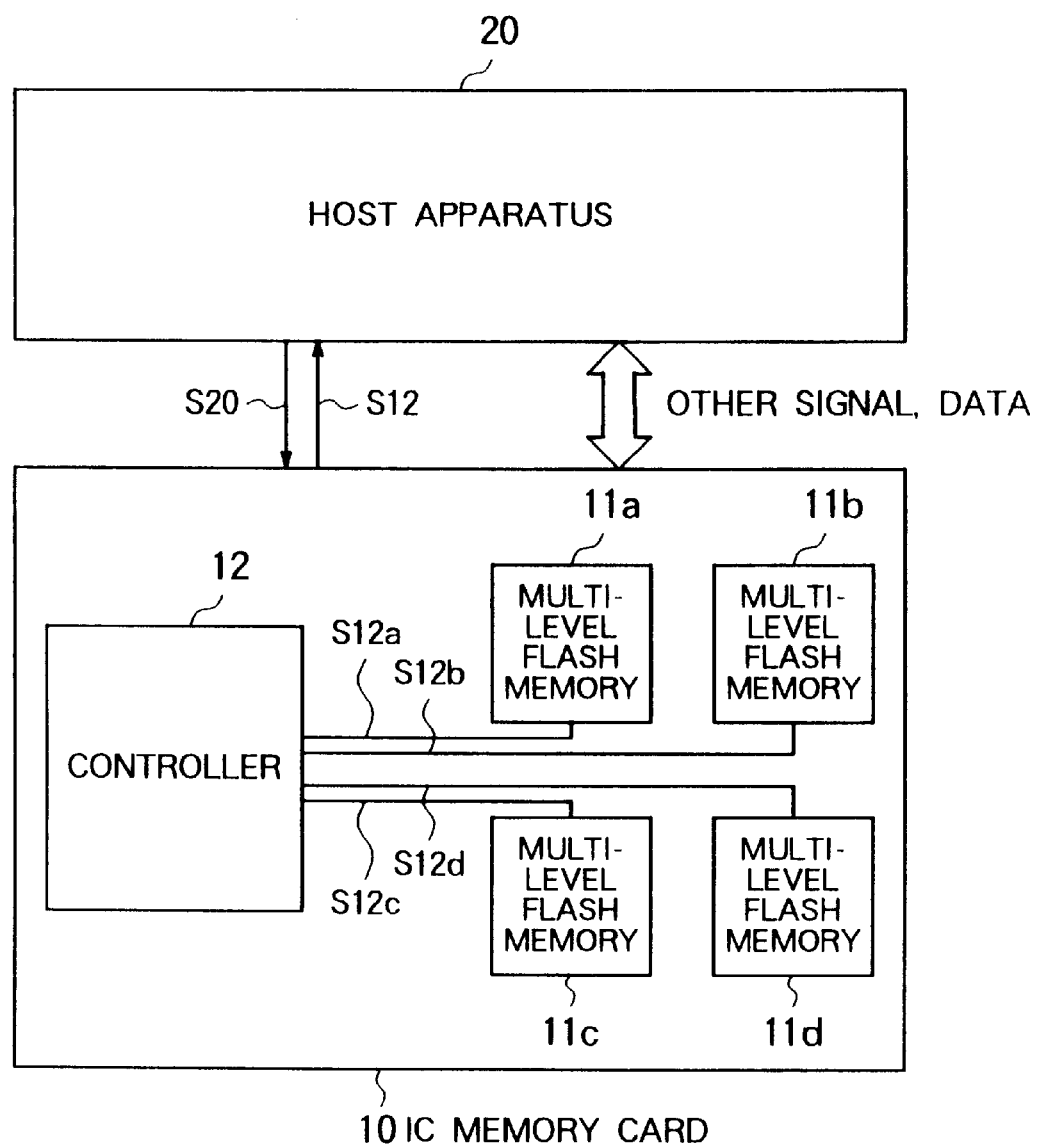
FIG. 1 is a block diagram of the configuration of an embodiment of an IC memory card (flash memory card) system using a nonvolatile semiconductor memory device according to the present invention.

FIG. 1 is a block diagram of the configuration of an embodiment of an IC memory card (flash memory card) system using a nonvolatile semiconductor memory device according to the present invention.

As shown in FIG. 1, this IC memory card system is constituted by an IC memory card 10 and a host apparatus 20 capable of storing/reproducing data with the IC memory card 10.

The IC memory card 10 is provided with multi-level type flash memory chips 11a, 11b, 11c, and 11d and a controller 12 as principal constituent elements and is constituted so as to enable free setting, in accordance with the usage application, of a plurality of modes, that is, use where the storage capacity is large, but there is a reduction in the write/erase speed or the guaranteed number of repeated rewrites and use where the storage capacity is small, but there is no reduction in the write/erase speed or the guaranteed number of repeated rewrites.

This IC memory card 10 can be used both for data apparatuses such as the host apparatus 20 and for general consumer electronics by just changing the mode setting.

Below, for easier understanding, the explanation will be made of use where the storage capacity is large, but there is a reduction in the write/erase speed or the guaranteed number of repeated rewrites as the LP (Long Play) mode and of use where the storage capacity is small, but there is no reduction in the write/erase speed or the guaranteed number of the repeated rewrites as the SP (Short Play) mode.

The mode can be set in the IC memory card 10 according to the present embodiment by setting the entire data storage region of the IC memory card 10 to the LP mode or the SP mode as shown in FIG. 2A and FIG. 2B or by setting parts of the storage region of the IC memory card 10 to the LP mode or the SP mode as shown in FIG. 3A and FIG. 3B.

In the case of setting parts of the storage region to the LP mode or the SP mode, it is possible to set the mode for every write/erase unit (block) of the flash memory (for example, 8 Kbytes is the erase unit in the case of a binary 64 Mbit NAND type flash memory) as shown in FIG. 3A or to set the mode for every mounted flash memory chip as shown in FIG. 3B.

Note that the example shown in FIG. 3B is the case where four flash memory chips are mounted.

The multi-level type flash memory chips 11a to 11d receive control signals S12a to S12d containing an operation mode designation from the controller 12 to change the number of levels of the multi-level data and store the data from the host apparatus 20 or read the data.

As to changing the number of levels of the multi-level data, it is possible, for example, to change 2 bits (4-level)/cell to a 1 bit (binary)/cell or vice versa, change 3 bits (8-level)/cell to 2 bits (4-level)/cell and vice versa, and change 3 bits (8-level)/cell to 1 bit (binary)/cell and vice versa.

Under the control by the controller 12, the IC memory card is controlled so as to make the number of levels of the multi-level data high and the storage capacity large in the LP mode and is controlled so as to make the number of levels of the multi-level data low and the storage capacity small in the SP mode.

Below, in the present embodiment, the explanation will be made by taking as an example the case of changing 2 bits (4-level)/cell to 1 bit (binary)/cell and vice versa.

Figure 4:
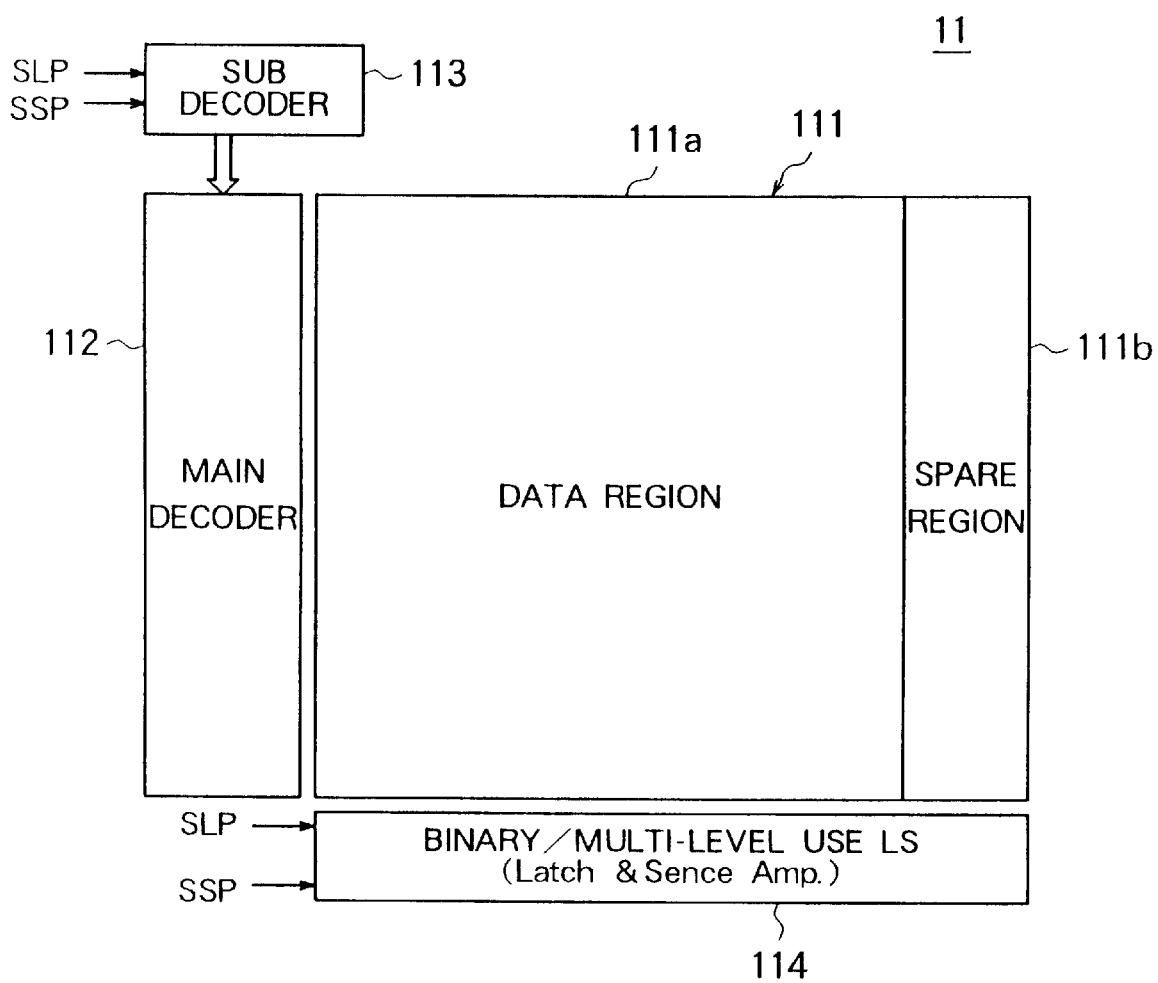
FIG. 4 is a block diagram of an example of the configuration of a flash memory chip according to the present invention.

FIG. 4 is a block diagram of an example of the configuration of the flash memory chip 11a (to 11d) according to the present invention.

This flash memory chip 11 is constituted by, as shown in FIG. 4, a memory array 111, a main decoder 112, a sub decoder 113, and a multi-level use latch and sense amplifier circuit (LS) 114.

The memory array 111 is constituted by a data region 111a and a spare region 111b. For example, management information of the data stored in the data region 111a is stored in the spare region 111b.

The data region 111a and the spare region 111b are driven by the single main decoder 112.

Figure 5:
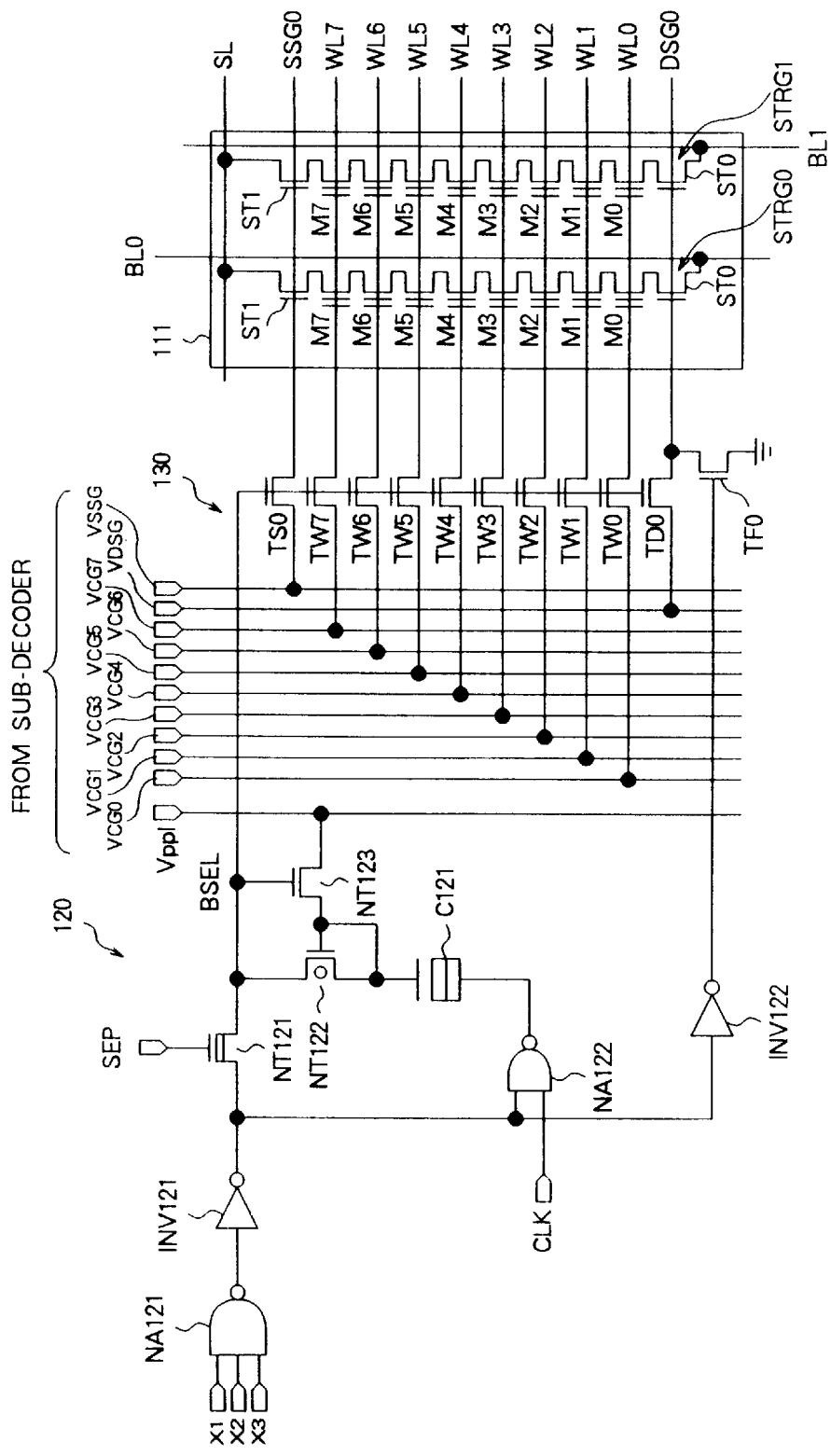
FIG. 5 is a circuit diagram of a concrete example of the configuration of a memory array and a main decoder of FIG. 4.

FIG. 5 is a circuit diagram of a concrete example of the configuration of the memory array 111 and the main decoder 112. In FIG. 5, a NAND type flash memory is shown as an example.

As shown in FIG. 5, in the memory array 111, memory strings STRG0, STRG1, . . . each constituted by eight serially connected memory transistors M0 to M7 and two selection transistors ST0 and ST1 serially connected to the two ends thereof are arranged in the form of a matrix.

For example, the string STRG0 is allocated as the data region 111a, and the string STRG1 is allocated as the spare region 111b.

The selection transistor ST0 connected to the drain of the memory transistor M0 of the memory string STRG0 is connected to a bit line BL0, and the selection transistor ST0 connected to the drain of the memory transistor M0 of the memory string STRG1 is connected to a bit line BL1.

Further, the selection transistors ST1 to which the memory transistors M7 of the memory strings STRG0 and STRG1 are connected are connected to a common source line SL.

Further, gate electrodes of the memory transistors of the memory strings STRG0 and STRG1 arranged in the same row are connected to common word lines WL0 to WL7, the gate electrodes of the selection transistors ST0 are connected to a common selection gate line DSG0, and the gate electrodes of the selection transistors ST1 are connected to a common selection gate line SSG0.

The main decoder 112 is constituted by a main row decoder 120, a transfer gate group 130 which is controlled in its conductive state by the main row decoder 120, word line and selection gate line use drive voltage supply lines VCG0 to VCG7, VDSG, and VSSG from a (not illustrated) sub decoder, and a supply line Vpp1 of a program voltage Vpp connected to the main row decoder 120.

The transfer gate group 130 is constituted by transfer gates TW0 to TW7, TD0, TS0, and TF0.

Specifically, the transfer gates TW0 to TW7 operationally connect the word lines WL0 to WL7 and the drive voltage supply lines VCG0 to VCG7 in accordance with an output signal BSEL of the main row decoder 120, respectively. The transfer gates TD0 and TS0 similarly operationally connect the selection gate lines DSG0 and SSG0 and the drive voltage supply lines VDSG and VSSG in accordance with the output signal BSEL of the main row decoder 120.

Further, the transfer gate TF0 is provided for preventing the selection gate line DSG0 from floating in the case of non-selection and connects the selection gate line DSG0 to a ground line at the time of non-selection.

Further, the main row decoder 120 is constituted by a 3-input NAND circuit NA121, inverters INV121 and INV122, a 2-input NAND circuit NA122, depletion type NMOS transistor NT121, enhancement type NMOS transistors TN122 (low threshold voltage) and NT123, and a capacitor C121 formed by connecting the source and the drain of the MOS.

The 3-input terminal of the NAND circuit NA121 is connected to input lines of address decode signals X1, X2, and X3, respectively, while an output terminal is connected to the input terminal of the inverter INV121.

The output terminal of the inverter INV121 is connected to one input terminal of the NAND circuit NA122 and the input terminal of the inverter INV122 and, connected via the NMOS transistor NT121 with the gate connected to the supply terminal SEP of the control signal to the source of the NMOS transistor NT122 and the gate electrode of the NMOS transistor NT123.

The other input terminal of the NAND circuit NA122 is connected to the input line of the clock signal CLK, while the output terminal is connected to one electrode of the capacitor C121. The other electrode of the capacitor C121 is connected to the drain and the gate electrode of the NMOS transistor NT122, while the connection point of the drain and the gate electrode of this is connected to the program voltage supply line Vpp1 via the NMOS transistor NT123.

The output terminal of the inverter INV122 is connected to the gate of the transfer gate TFD0 of the transfer gate group 130.

In such a configuration, the reading of the data of the memory transistors M3 of the memory strings STRG0 and STRG1 and the writing of the data into the memory transistors M3 are carried out as follows.

At the time of reading, a ground voltage GND (0V) is supplied to the drive voltage supply line VCG3 by is not illustrated sub decoder, P5V (for example 4.5V) is supplied to the drive voltage supply lines VCG0 to VCG2 and VCG4 to VCG7 and the drive voltage supply lines VDSG and VSSG, P5V is supplied to the program voltage supply line Vpp1, and the ground voltage 0V is supplied to the source line SL.

The active address signals X1, X2, and X3 are input to the main row decoder 120, while the output signal BSEL of the main row decoder 120 is output at a level of P5V+α.

By this, the transfer gates TW0 to TW7 and TD0 and TS0 of the transfer gate group 130 become in a conductive state. At this time, the transfer gate TF0 is held in a nonconductive state.

As a result, the selection transistors ST0 and ST1 of the memory strings STRG0 and STRG1 become in a conductive state, and the data is read to the bit lines BL0 and BL1.

At the time of writing, a high voltage, for example, 20V, is supplied to the drive voltage supply line VCG3 selected by the sub decoder 13, an intermediate voltage (for example, 10V) is supplied to the drive voltage supply lines VCG0 to VCG2 and VCG4 to VCG7, a power supply voltage $V_{cc}$ (for example 3.3V) is supplied to the drive voltage supply line VDSG, the ground voltage GND is supplied to the drive voltage supply line VSSG, and for example 20V is supplied to the program voltage supply line Vpp1.

Further, the ground voltage GND is supplied to the bit line BL0 to which the memory string STRG0 having the memory transistor M3 to be written, and the power supply voltage $V_{cc}$ is supplied to the bit line BL1 to which the memory string STRG1 having the memory transistor M3 to be inhibited from being written is connected.

The active address signals X1, X2, and X2 are input to the main row decoder 120, while the output signal BSEL of the main row decoder 120 is output at a level of 20V+α.

By this, the transfer gates TW0 to TW7 and TD0 and TS0 of the transfer gate group 130 become conductive state.

As a result, the write voltage 20V is supplied to the selection word line WL3, and a pass voltage (intermediate voltage) Vpass (for example 10V) is supplied to the non-selected word lines WL0 to WL2 and WL4 to WL7.

By this, the selection transistor ST0 of the memory string STRG1 becomes cut-off and channel portions of the memory string STRG1 to which the memory transistor to be inhibited from being written is connected become floating. As a result, the voltages of these channel portions are boosted mainly by capacitor coupling with the pass voltage Vpass supplied to the non-selected word line and rise up to the write inhibit voltage, whereby the writing of data to the memory transistor M3 of the memory string STRG1 is inhibited.

On the other hand, the channel portion of the memory string STRG0 to which the memory transistor to be written is connected is set at the ground voltage GND (0V), the data is written in the memory transistor M3 by the voltage difference from the write voltage 20V supplied to the selected word line WL3, and the threshold voltage shifts in a forward direction and becomes for example from −3V of the erasing state to about 2V.

The sub decoder 113 receives the control signals SLP (S12a to S12d) instructing operation in the LP mode from the controller 12 in the case of use where the storage capacity is large, but there is a reduction in the write/erase speed or the guaranteed number of the repeated rewrites, while receives the control signals SSP (S12a to S12d) instructing operation in the SP mode from the controller 12 in the case of use where the storage capacity is small, but there is no reduction in the write/erase speed or the guaranteed number of the repeated rewrites, and supplies a drive voltage in accordance with the operation mode to the main decoder 112.

The binary/multi-level latch sense amplifier circuit (LS) 114 receives the control signals SLP (S12a to S12d) instructing operation in the LP mode operation from the controller 12 and operates as a multi-level use latch and sense amplifier circuit in the case of use where the storage capacity is large, but there is a reduction in the write/erase speed or the guaranteed number of the repeated rewrites, while receives the control signals SSP (S12a to S12d) instructing operation in the SP mode from the controller 12 and operates as a binary use latch and sense amplifier circuit in the case of use where the storage capacity is small, but there is no reduction in the write/erase speed or the guaranteed number of the repeated rewrites.

Figure 6:
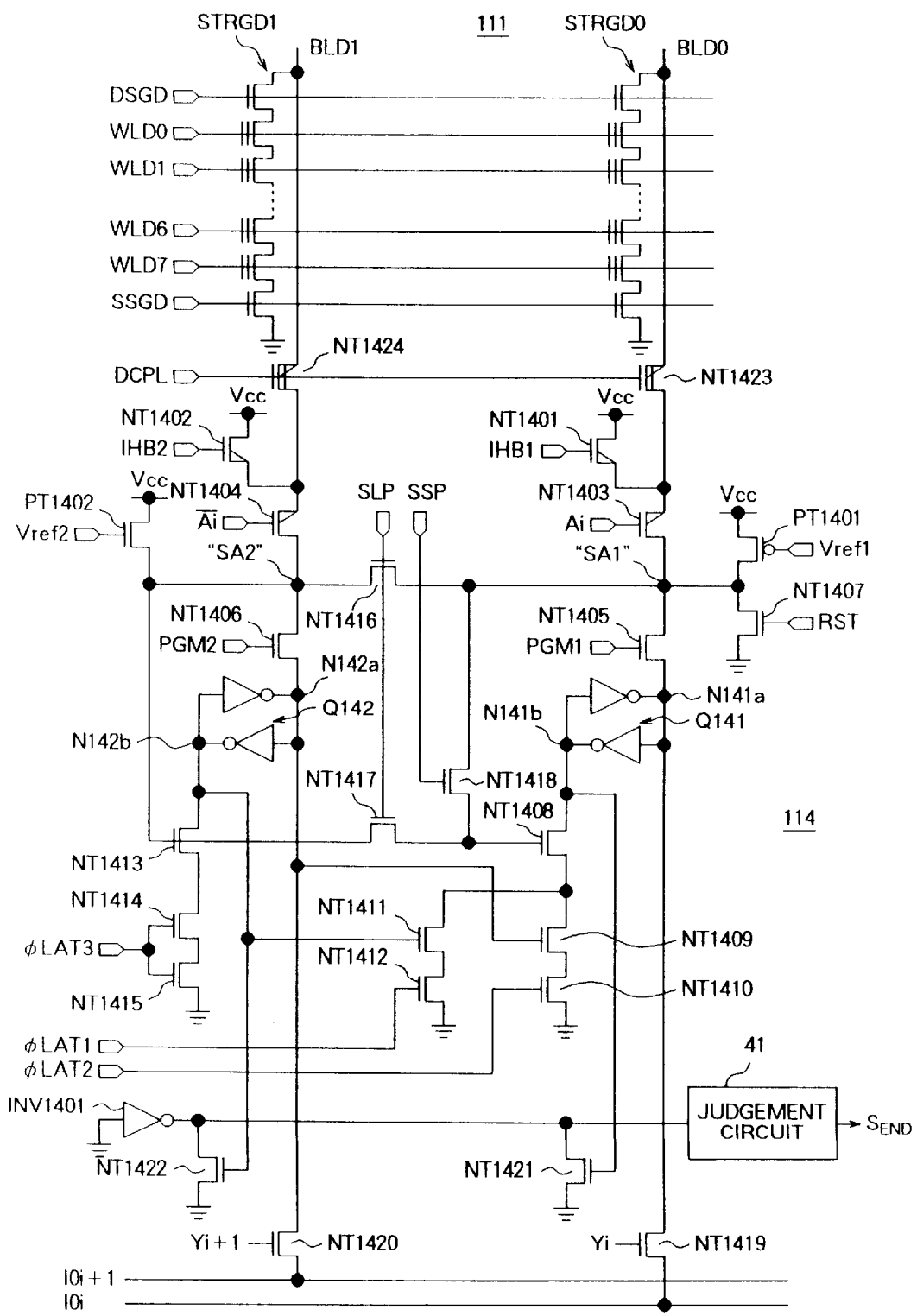
FIG. 6 is a circuit diagram of a concrete example of the configuration a binary/multi-level latch and sense amplifier circuit.

FIG. 6 is a circuit diagram of a concrete example of the configuration of this binary/multi-level latch and sense amplifier circuit (LS) 114. In FIG. 6, a NAND type flash memory is shown as an example.

The binary/multi-level latch and sense amplifier circuit 114 is constituted by, as shown in FIG. 6, NMOS transistors NT1401 to NT1424, PMOS transistors PT1401 and PT1402, an inverter INV1401, and latch circuits Q141 and Q142 formed by connecting the inputs and the outputs of the inverters with each other.

The NMOS transistor NT1401 is connected between the supply line of the power supply voltage $V_{cc}$ and the bit line BLD0, and the gate electrode is connected to the supply line of the inhibit signal IHB1. The NMOS transistor NT1402 is connected between the supply line of the power supply voltage $V_{cc}$ and the bit line BLD1, and the gate electrode is connected to the supply line of the inhibit signal IHB2.

A depletion type NMOS transistor NT1423 is connected between the connection point of the bit line BLD0 and the NMOS transistor NT1401 and the connection point of the memory string STRGD0 and the bit line BLD0, and a depletion type NMOS transistor NT1424 is connected between the connection point of the bit line BLD1 and the NMOS transistor NT1402 and the connection point of the memory string STRGD1 and the bit line BLD1. The gates of the NMOS transistors NT1423 and NT1424 are connected to a decouple signal supply line DCPL.

The NMOS transistors NT1403, NT1405, and NT1419 are connected in series between the connection point of the bit line BLD0 and the NMOS transistor NT1401 and a bus line $IO_i$, and the NMOS transistors NT1404, NT1406, and NT1420 are connected in series between the connection point of the bit line BLD1 and the NMOS transistor NT1402 and a bus line $IO_{i+1}$.

A node SA1 comprising the connection point of the NMOS transistors NT1403 and NT1405 is grounded via the NMOS transistor NT1407 and, connected to the drain of the PMOS transistor PT1401 and is further connected to the gate electrode of the NMOS transistor NT1408 via the NMOS transistor NT1418.

Further, a node SA2 comprising the connection point of the NMOS transistors NT1404 and NT1406 is connected to the drain of the PMOS transistor PT1402 and the gate electrode of the NMOS transistor NT1413.

The node SA1 and the node SA2 are connected via the NMOS transistor NT1416, and the gate electrode of the NMOS transistor NT1413 and the gate electrode of the NMOS transistor NT1408 are connected via the NMOS transistor NT1417.

The gate of the NMOS transistor NT1407 is connected to the supply line of the reset signal RST, the source of the PMOS transistor PT1401 is connected to the supply line of the power supply voltage $V_{cc}$, and the gate of the PMOS transistor PT1401 is connected to the supply line of the signal Vref1.

Further, the source of the PMOS transistor PT1402 is connected to the supply line of the power supply voltage $V_{cc}$, and the gate of the PMOS transistor PT1402 is connected to the supply line of the signal Vref2.

Further, gate electrodes of the NMOS transistors NT1416 and NT1417 are connected to the supply line of the LP mode signal (multi-level) signal SLP, and the gate electrode of the NMOS transistor NT1418 is connected to the supply line of the SP mode signal SSP.

A first storage node N141a of the latch circuit Q141 is connected to the connection point of the NMOS transistors NT1405 and NT1419, and the second storage, electrode N141b is grounded via the NMOS transistors NT1408 to NT1410 connected in series.

A first storage node N142a of the latch circuit Q142 is connected to the connection point of the NMOS transistors NT1406 and NT1420, and the second storage electrode N142b is grounded via the NMOS transistors NT1413 to NT1415 connected in series.

Further, the connection point of the NMOS transistors NT1408 and NT1409 is grounded via the serially connected NMOS transistors NT1411 and NT1412.

The gate of the NMOS transistor NT1409 is connected to the first storage node N142a of the latch circuit Q142, the gate of the NMOS transistor NT1410 is connected to the supply line of the latch signal φLAT2, the gate of the NMOS transistor NT1411 is connected to the second storage node N142b, the gate of the NMOS transistor NT1412 is connected to the supply line of the latch signal φLAT1, and the gates of the NMOS transistors NT1414 and NT1415 are connected to the supply line of the latch signal φLAT3.

The gate of the NMOS transistor NT1419 serving as the column gate is connected to the supply line of a signal Yi, and the gate of the NMOS transistor NT1420 serving as the column gate is connected to the supply line of a signal Yi+1.

Further, the input terminal of the inverter INV1401 is grounded, and the output terminal is connected to the judgement circuit 41. Further, NMOS transistors NT1421 and NT1422 are connected in parallel between the output terminal of the inverter INV1401 and the ground line. The gate electrode of the NMOS transistor NT1421 is connected to the second storage node N141b of the first latch circuit Q141, and the gate electrode of the NMOS transistor NT1422 is connected to the second storage node N142b of the second latch circuit Q142.

The judgement circuit 41 judges whether or not the writing is ended with respect to all memory cell transistors by the voltage of the output line of the inverter INV1401 at the time of a write operation and outputs the end signal $S_{END}$ to the sub decoder 113 when judging that the writing is ended.

Specifically, when the writing is completed, the first storage nodes N141a and N142a of the latch circuits Q141 and Q142 become the power supply voltage $V_{cc}$ level, and the second storage nodes N141b and N142b become the ground level. As a result, the NMOS transistors NT1421 and NT1422 are held in the non-conductive state and the voltage of the output line of the inverter INV2401 becomes the power supply voltage $V_{cc}$ level. It is judged by this that the writing is ended.

On the other hand, when there is a cell which is not sufficiently written, any or all of the first storage nodes N141a and N142a of the latch circuits Q141 and Q142 become the ground level, and the second storage nodes N141b and N142b become the power supply voltage $V_{cc}$ level. As a result, the NMOS transistor NT1421 or NT1422 or both transistors are held in the conductive state and the voltage of the output line of the inverter INV1401 becomes the ground level. It is judged by this that there is a cell which is not sufficiently written.

Here, an explanation will be made of one example of the operation at the time of reading and writing (programming) of the binary/multi-level latch and sense amplifier circuit 114 in relation to FIGS. 7A to 7K, FIGS. 8A to 8N, FIGS. 9A to 9P, and FIGS. 10A to 10N.

FIGS. 7A to 7K show timing charts at the time of reading 4-level data, while FIGS. 8A to 8N show timing charts at the time of writing (programming) 4-level data. Further, FIGS. 9A to 9P show timing charts at the time of reading binary data, while FIGS. 10A to 10N show timing charts at the time of writing (programming) binary data.

Note that, as understood from FIGS. 8A to 8N, the writing of the 4-level data of the present example is carried out in 3 steps. Originally, the operation routine shifts to the next step at the stage where it is decided that all cells to be written when writing in units of pages have been sufficiently written at each step. However, the present invention is not limited to this write method.

First, when reading or writing 4-level data, the LP mode signal SLP is input at an active high level, and the SP mode signal SSP is input at a low level (not illustrated in FIGS. 7A to 7K and FIGS. 8A to 8N).

By this, the NMOS transistors NT1416 and NT1417 become conductive, the NMOS transistor NT1418 is held in the non-conductive state, the nodes SA1 and SA2 are electrically connected, and the voltage of the node SA1 is not directly transmitted to the gate electrode of the NMOS transistor NT1408 via the NMOS transistor NT1418.

Next, an explanation will be made of the operation for reading 4-level data.

First, the reset signal RST and signals PGM1 and PGM2 are set at a high level. By this, the first storage nodes N141a and N142a of the latch circuits Q141 and Q142 are pulled to the ground level. As a result, the latch circuits Q141 and Q142 are cleared.

Next, the reading is carried out by setting the word line voltage at for example 2.4V. If the threshold voltage Vth is higher than the word line voltage (2.4V), the cell current does not flow, therefore the bit line voltage holds the precharge voltage, and its high level is sensed. On the other hand, if the threshold voltage Vth is lower than the word line voltage (2.4V), the cell current flows, therefore the bit line voltage falls, and its low level is sensed.

Next, the reading is carried out at for example the word line voltage of 1.2V, and, finally, the reading is carried out at the word line voltage of 0V. Then, after the reading is carried out three times to obtain the 2-bit data, the data is output to the buses $IO_{set}$ and $IO_i$.

Specifically, when the cell data is "00", the current does not flow in all word lines, therefore (1, 1) is output to the buses $IO_{i+1}$ and $IO_i$. First, when reading the data by setting the word line voltage at 2.4V, the latch signal φLAT1 is set at a high level. At this time, the cell current does not flow, so the bit line is held at a high level, therefore, the NMOS transistor NT1408 is held in the conductive state and the latch circuit Q142 is cleared, whereby the second storage node N142b of the latch circuit Q142 is held at a high level, therefore the NMOS transistor NT1411 is held in the conductive state. Accordingly, the NMOS transistors NT1408, NT1411, and NT1412 are held in the conductive state, the second storage node N141b of the latch circuit Q141 is pulled to the ground level, and the first storage node N141a of the latch circuit Q141 shifts to the high level.

Next, when reading the data by setting the word line voltage at for example 1.2V, the latch signal φLAT3 is set at a high level. At this time, the cell current does not flow, so the bit line is held at a high level, therefore the NMOS transistor NT1413 is held in the conductive state, the second storage node N142b of the latch circuit Q142 is pulled to the ground level, and the first storage node N142a of the latch circuit Q142 shifts to a high level. Finally, when reading the data by setting the word line voltage at 0V, the latch signal φLAT1 is set at a high level. At this time, the cell current does not flow, so the bit line is held at high level, therefore the NMOS transistor NT1408 is held in the conductive state, but since the second storage node N142b of the latch circuit Q142 is at a low level, the NMOS transistor NT1411 becomes the non-conductive state, and the first storage node N141a of the latch circuit Q141 holds its low level.

When the cell data is "01", the current flows only in the case of a predetermined word line voltage, and (1, 0) is output to the buses $IO_{i+1}$ and $IO_i$. First, when reading the data by setting the word line voltage at 2.4V, the latch signal φLAT1 is set at a high level. At this time, since the cell current flows, the bit line is held at low level, so the NMOS transistor NT1408 is held in the non-conductive state, and the first storage node N141a of the latch circuit Q141 holds its low level.

Next, when reading the data by setting the word line voltage at 1.2V, the latch signal φLAT3 is set at a high level. At this time, the cell current does not flow, so the bit line is held at a high level, therefore the NMOS transistor NT1413 is held in the conductive state, the second storage node N142b of the latch circuit Q142 is pulled to the ground level, and the first storage node N142a of the latch circuit Q142 shifts to a high level. Finally, when reading the data by setting the word line voltage at 0V, the latch signal φLAT1 is set at a high level. At this time, the cell current does not flow, so the bit line is held at a high level, therefore the NMOS transistor NT1408 is held in the conductive state, but since the second storage node N142b of the latch circuit Q142 is at a low level, the NMOS transistor NT1411 becomes the non-conductive state, and the first storage node N141a of the latch circuit Q141 holds its low level.

Even in the case where the cell data is "10" and "11", similarly (0, 1) and (0, 0) are read to the buses $IO_{i+1}$ and $IO_i$.

Next, an explanation will be made of the write operation.

In the circuit of FIG. 6, first the writing is carried out by the data stored in the latch circuit Q141, next the writing is carried out by the data of the latch circuit Q142, and finally the writing is carried out by the data of the latch circuit Q141.

When the write data is (Q2, Q1)=(1, 0), the data inverts from "0" to "1" if the latch circuit Q141 becomes the write insufficient state, but in the case of (Q2, Q1)=(0, 0), it is necessary for the latch circuit Q141 to use the same also as the write data of the third step, therefore the data does not (can not) invert from "0" to "1" even if the writing is sufficient at the first step.

In the judgement of the end of the writing at each step, the end of the writing of the step is judged when the latched data becomes all "1".

In a cell with the write data (Q2, Q1)=(0, 0), there is no inversion of the latch circuit Q141 at the first step, therefore there is no judgement of the end by the wired OR.

When reading or writing binary data, the SP mode signal SSP is input at an active high level, and the LP mode signal SLP is input at a low level (not illustrated in FIGS. 7A to 7K and FIGS. 8A to 8N).

By this, the NMOS transistor NT1418 is held in the conductive state, the NMOS transistors NT1416 and NT1417 become the non-conductive state, and the nodes SA1 and SA2 become the electrically non-connected state. The voltage of the node SA1 is directly transmitted to the gate electrode of the NMOS transistor NT1408 via the NMOS transistor NT1418.

Further, "Ai", "/Ai" are all selected (both are $V_{cc}$), and both of "IHB1" and "IHB2" are fixed at GND, whereby the bit lines and the data latches enter into a one-to-one relationship, and a binary operation becomes possible.

Here, a detailed explanation of the reading and writing of binary data will be omitted.

Further, in the control of the read/verify operation, by setting the signal φLAT3 at a high level, the potential of the node SA2 is reflected at the latch circuit Q142, while by simultaneously setting the signals φLAT1 and φLAT2 at a high level, either of the NMOS transistor NT1411 or NMOS transistor NT1409 becomes conductive, and the potential of the node SA1 is reflected at the latch circuit Q141.

As described above, for example, when the nonvolatile semiconductor memory device of the present embodiment is applied to an IC memory card, a multi-level flash memory which can be changed to a binary flash memory without changing the specifications of the IC memory card is realized.

The controller 12 receives for example the mode switch signal S20 for switching the mode to the LP or SP mode transmitted from the host apparatus 20, outputs control signals S12a to S12d in accordance with the LP mode or SP mode to the flash memory chips 12a to 12d, and transfers the data between the host apparatus 20 and the flash memory chips 12a to 12d, that is, controls the write (and erase) operation or read operation.

Further, the controller 12 outputs a mode discrimination signal S12 for informing which mode, LP or SP, the current IC memory card 10 is set to the host apparatus 20.

The LP/SP mode switch signal S20 can be sent to the IC memory card 10 as a command at any time by the user of the host apparatus 20 if the host apparatus 20 handles both modes.

Further, if the host apparatus 20 is limited to one of the modes, the mode switch signal S20 is automatically issued from the host apparatus 20 to the IC memory card 10 and the card is used only in the specific mode.

The mode discrimination signal S12 is issued from the IC memory card 10 to the host apparatus, whereby the host apparatus 20 processes the data (read operation etc.) in accordance with the mode.

Further, the controller 12 performs the switching of the binary/multi-level data latch or the processing for making the page size always constant by the control signals S12a to S12d controlling the number of levels of the multi-level data of the multi-level flash memory at the time of reading the data.

The controller 12 has to store the mode set in the IC memory card 10 at some position of the IC memory card. This mode data is stored by one of the methods shown in for example FIGS. 11A to 11C.

Figure 11A:
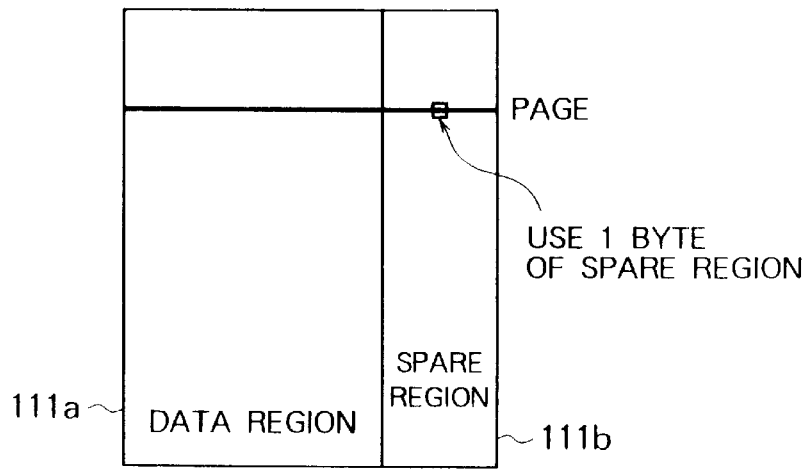
FIGS. 11A to 11C are views for explaining methods of storage of mode data.

The method shown in FIG. 11A is the method of storing the mode in write/read units of the flash memory, that is, units of pages.

Specifically, one byte of the spare (management) region (spare (redundant) region in the NAND type flash memory) 111b in the page is allocated for this storage.

Figure 11B:
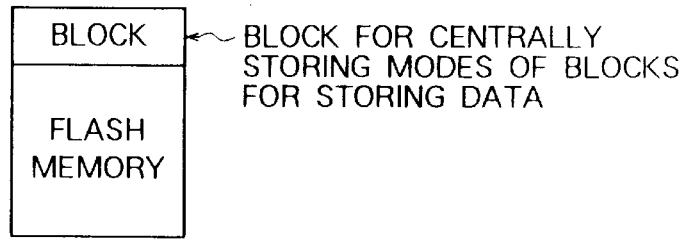

The method shown in FIG. 11B is the method of centrally storing the mode data in a specific region (block) of the flash memory.

Figure 11C:
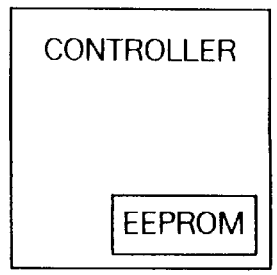

The method shown in FIG. 11C is the method of mounting a nonvolatile memory such as an EEPROM on the chip of the controller 12 and storing the set mode in this EEPROM.

As this mode data stored, the mode data is of the entire IC memory card 10 or the mode data for every minimum unit (block) of the flash memory is centrally stored.

Note that it is also possible to constitute the EEPROM or other nonvolatile memory on a separate chip from the controller 12.

By adopting the above method, as explained by referring to FIG. 3, it is possible to mix the LP and SP modes in the IC memory card 10.

Further, the controller 12 performs control to make the plurality of rows accessed (written/read) when the number of levels of the multi-level data is high one page when making the number of levels of the multi-level data low so that the page size is held constant even if the number of levels of the multi-level data is changed when changing the storage capacity.

Specifically, the controller 12 performs control to make the two rows accessed in a 4-level data operation one page in a binary data operation when changing from a 4-level data to a binary data mode.

Next, an explanation will be made of the operation of the system shown in FIG. 1.

When the IC memory card 10 is set in the host apparatus 20, for example, the mode data stored by the method as shown in FIGS. 11A to 11C is read from the controller 12 of the IC memory card 10, and the mode discrimination signal S12 indicating the set mode is output to the host apparatus 20.

The host apparatus 20 side transmits the mode switch signal S20 to the IC memory card 10 so as to store of the data in the LP mode or SP mode intended by the user of the host apparatus 20 upon receipt of for example the mode discrimination signal S12.

Further, the mode switch signal S20 is also used to indicate whether all or part of the IC memory card 10 is to be used in the LP/SP mode.

The IC memory card 10 receiving the mode switch signal S20 then stores the mode data by the predetermined method under the control of the controller 12.

Note that the LP/SP mode switch signal S20 may be sent to the IC memory card 10 as a command at any time by the user of the host apparatus 20 if the host apparatus 20 is designed to handle both modes.

Further, if the host apparatus 20 is limited to one of the modes, the mode switch signal S20 is automatically issued from the host apparatus 20 to the IC memory card 10 and the card is used only in the specific mode.

The IC memory card 10 then processes (read operation etc.) the data in accordance with the mode designated by the mode discrimination signal S12.

The write and read operations in the flash memory chips 11a to 11d are carried out in accordance with the LP/SP mode as explained with reference to FIG. 4 to FIGS. 10A to 10N (here, a detailed explanation thereof is omitted).

As explained above, the present embodiment was configured so that the maximum storage capacity can be changed for all or part of the IC memory card 10. A mode in which the maximum storage capacity is small is adopted for uses in which the write/read speed is fast or a high guaranteed number of the repeated rewrites is required, while a mode in which the maximum storage capacity is large is adopted for uses in which the write/read speed is slow or a high guaranteed number of the repeated rewrites is not required. Therefore, there is an advantage that a change of the method of use becomes possible according to the application in the same IC memory card 10.

Note that the present embodiment was configured so that the mode was switched by the transfer of commands with the host apparatus 20, but in the case of use of the IC memory card 10 as a whole in the LP mode or SP mode, it is also possible to make the card a dedicated LP mode card or a dedicated SP mode card by giving a characterizing feature to part of the outer shape of the card using for example one of the methods shown in FIGS. 12A to 12D.

In this case, the host apparatus 20 does not discriminate the mode based on the mode discrimination signal S12 transmitted from the IC memory card 10, but discriminates the mode from the IC memory card 10.

Figure 12A:
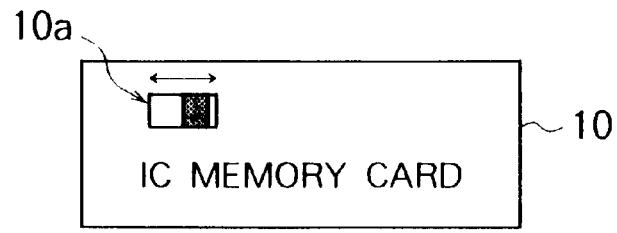
FIGS. 12A to 12D are views for explaining methods of setting an LP mode card or an SP mode card by giving special characteristics to parts of the outer shape of the card.

The method shown in FIG. 12A is to provide a slide switch 10a at a peripheral portion of the IC memory card 10 and to discriminate whether the card is a dedicated LP mode card or dedicated SP mode card by the position of this slide switch 10a.

Figure 12B:
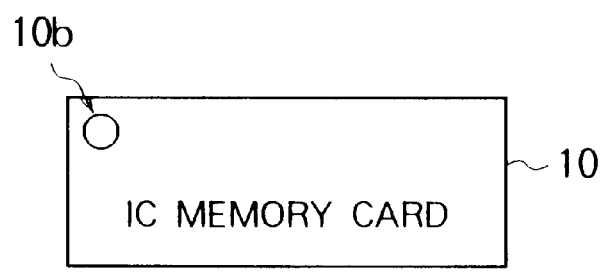

The method shown in FIG. 12B is to provide a hole or hollow 10b at a peripheral portion of the IC memory card 10 and to discriminate whether the card is a dedicated LP mode card or a dedicated SP mode card according to the position or existence of this hole or hollow 10b.

Figure 12C:
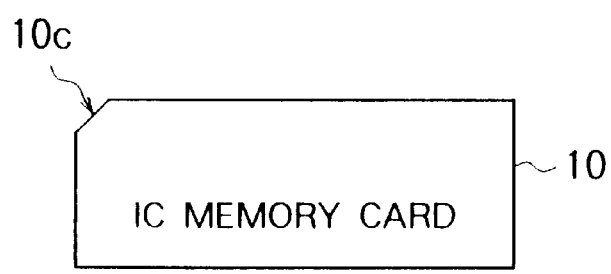

The method shown in FIG. 12C to provide a notch 10c at a peripheral portion of the IC memory card 10 and to discriminate whether the card is a dedicated LP mode card or a dedicated SP mode card according to the position or existence of this notch 10c.

Figure 12D:
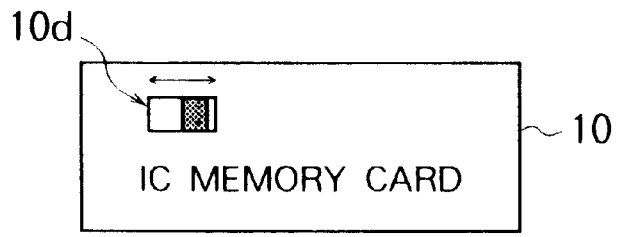

The method shown in FIG. 12D is to provide an electric on/off switch 10d at a peripheral portion of the IC memory card 10 and to discriminate whether the card is a dedicated LP mode card or a dedicated SP mode card according to an on/off signal sent in accordance with the setting of this on/off switch 10d.

Further, the number of the repeated rewrites in the LP mode is smaller than that in the SP mode. It is also possible to impart a function limiting use to the SP mode after the guaranteed number of rewrite in the LP mode (for example, 10,000) is exceeded.

Specifically, it is possible to provide a counter for counting the number of rewrites on the chip of the controller 12 of the IC memory card 10 or another chip and limiting use to the SP mode after the count exceeds the guaranteed value set in advance for the LP mode.

Figure 13:
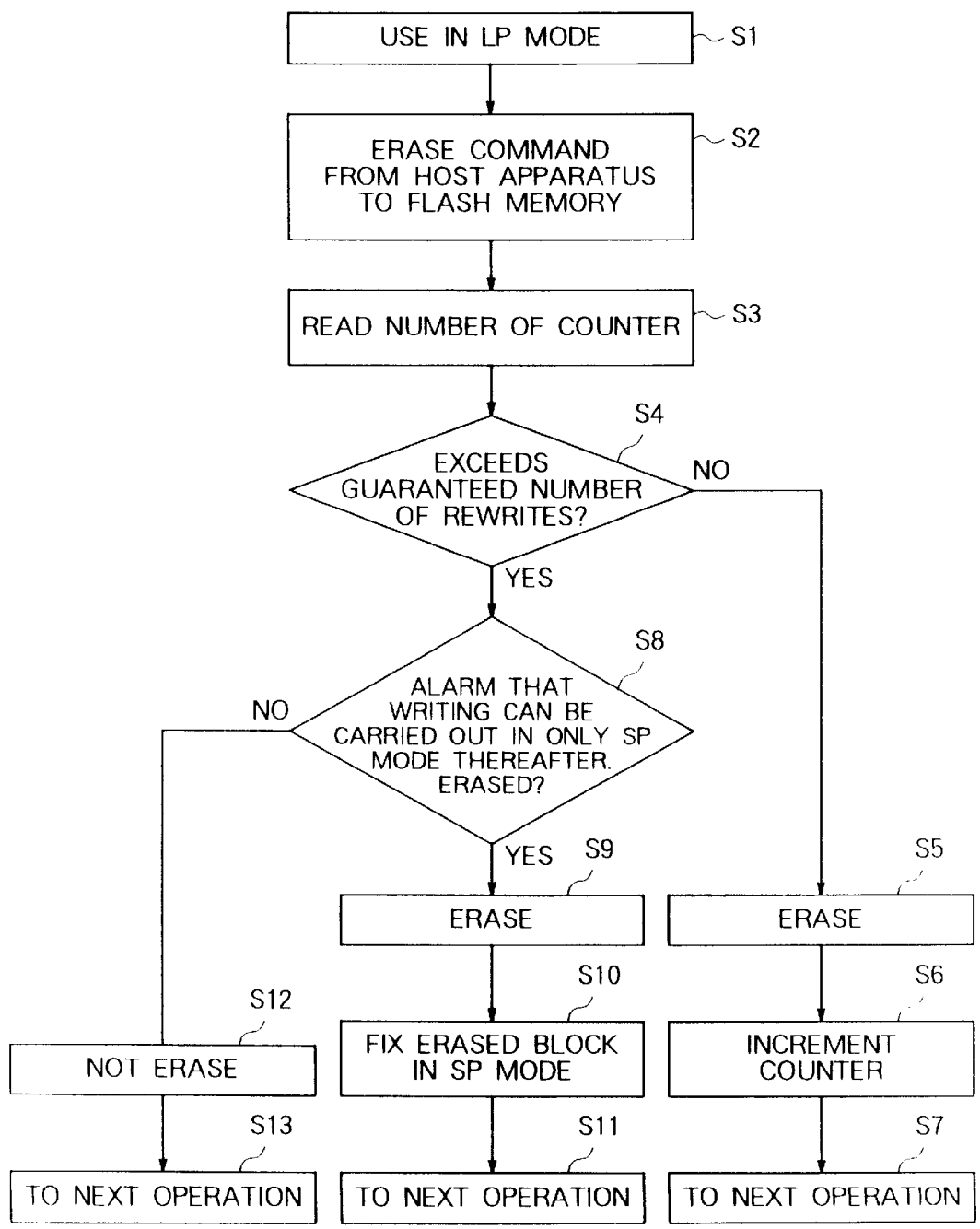
FIG. 13 is a flow chart of LP/SP mode switching processing based on a guaranteed number of rewrites.

FIG. 13 is a flow chart of the LP/SP mode switching processing based on the guaranteed number of rewrites.

This example is an example of performing the switch judgement processing upon receiving an erase command.

In the example of FIG. 13, initially the card is used in the LP mode having the large storage capacity (S1). The erase command from the host apparatus 20 is received, and the count of the counter is read by the controller 12 (S2, S3).

The controller 12 determines whether or not the read count exceeds the guaranteed number of rewrites set in advance (S4).

When it is determined at step S4 that the count does not exceeds the guaranteed number of rewrites, the erase operation with respect to the flash memory chip is carried out (S5), the counter is incremented by 1 (S6), and the operation routine proceeds to the next operation (S7).

On the other hand, when it is determined at step S4 that the count exceeds the guaranteed number of rewrites, the fact that the writing can thereafter only be performed in the SP mode is transmitted as an alarm signal to the host apparatus 20 side and that side is questioned as to whether erasure should be performed (S8).

When the response to step S8 is that erasure is to be carried out, the erase operation is carried out, the erased block is fixed in the SP mode, and the operation routinely proceeds to the next operation (S9 to S11).

On the other hand, when the response to step S8 is that erasure is not to be carried out, the erase operation is not carried out and the operation routine proceeds to the next operation (S12, S13).

In this way, by imparting a function of limiting use of the card to only the SP mode when the number of repeated rewrites in the LP mode is smaller than that in the SP mode and the guaranteed number of rewrites in the LP mode is exceeded, there is an advantage that an IC memory card capable of being changed in method of use in accordance with the application and, at the same time, having a high reliability can be realized.

Note that a counter is provided for every block when the mode is set for every write/erase unit, that is, block.

In the above explanation, the LP/SP modes used in an audio-video (AV) apparatus were used as an example, but naturally the present invention can be applied also to other apparatuses and other modes.

For example, it is possible to not only switch between two modes of for example LP and SP, but also switch among three or more modes.

Specifically, in the case where the flash memory stores 3-bit data (8-level data), it is also possible to constitute the same so that the first mode is used in the case of 3 bits (8-level)/cell, the second mode is used in the case of 2 bits (4-level)/cell, and the third mode is used in the case of 1 bit (binary)/cell.

Further, needless to say the present invention can be applied to devices other than an IC memory card.

As explained above, according to the present invention, there is the advantage that the method of use can be changed according to the purpose of use.

Further, when the guaranteed number of rewrites in the mode having a high number of levels of multi-level data is exceeded, the card can be used in a mode having a lower number of levels of the multi-level data, therefore an improvement of the reliability can be achieved.

Further, it is possible to fix different modes for different products using the same IC memory card by changing part of the outer shape of the card.

While the invention has been described with reference to specific embodiments chosen for purposes of illustration, it should be apparent that numerous modifications could be made thereto by those skilled in the art without departing from the basic concept and scope of the invention.

What is claimed is:

1. A nonvolatile semiconductor memory device comprising:
   a memory array region in which a plurality of memory cell transistors for storing multi-level data are arranged; and
   means for changing the storage capacity of said memory device by a means for changing the number of levels of the multi-level data to be stored in at least part of the memory array region,
   said means for changing the number of levels of the multi-level data performing the change in write/erase units when changing the storage capacity for at least part of the storage region.

2. A nonvolatile semiconductor memory device as set forth in claim 1, wherein the memory device performs the writing and reading of data in units of pages.

3. A nonvolatile semiconductor memory device as set forth in claim 2, further comprising:
   means for making a plurality of rows of said memory array region to be accessed when the number of levels of the multi-level data is high fit within one page when setting the number of levels of the multi-level data low, so that the page size is held constant even if changing the number of levels of the multi-level data.

4. A nonvolatile semiconductor memory device as set forth in claim 1, further comprising:
   a counter for counting the number of repeated write/erase operations of at least one among a plurality of storage capacity modes.

5. A nonvolatile semiconductor memory device as set forth in claim 4, wherein said means for changing the number of levels of the multi-level data changes the number of levels of the multi-level data to a lower setting so that the maximum storage capacity of at least one of the storage regions becomes smaller when said counter exceeds a guaranteed number of repeated rewrites in that mode.

6. A nonvolatile semiconductor memory device as set forth in claim 4, further comprising means for informing a host apparatus that there has been a change when changing the number of levels of the multi-level data to a lower setting so that the maximum storage capacity becomes smaller.

7. A nonvolatile semiconductor memory device as set forth in claim 5, further comprising means for informing a host apparatus that there has been a change when changing the number of levels of the multi-level data has been changed to a lower setting so that the maximum storage capacity becomes smaller.

8. An IC memory card for storing/reproducing data with an external apparatus, comprising:

a nonvolatile semiconductor memory device having a memory array region in which a plurality of memory cell transistors for storing multi-level data are arranged, a means for changing the storage capacity of said memory device by changing the number of levels of the multi-level data to be stored in at least part of the memory array region, said means for changing the number of levels of the multi-level data performing the change in write/erase units when changing the storage capacity for at least part of the storage region.

9. An IC memory card as set forth in claim 8, where in the memory device performs the writing and reading of data in units of pages.

10. An IC memory card as set forth in claim 9, further comprising:

means for making a plurality of rows of said memory array region to be accessed when the number of levels of the multi-level data is high fit within one page when setting the number of levels of the multi-level data low, so that the page size is held constant even if changing the number of levels of the multi-level data.

11. An IC memory card as set forth in claim 8, further comprising:

a counter for counting the number of repeated write/erase operations of at least one among a plurality of storage capacity modes.

12. An IC memory card as set forth in claim 11, wherein said means for changing the number of levels of the multi-level data changes the number of levels of the multi-level data to a lower setting so that the maximum storage capacity of at least one of the storage regions becomes smaller when said counter exceeds a guaranteed number of repeated rewrites in that mode.

13. An IC memory card as set forth in claim 12, further comprising:

means for informing a host apparatus that there has been a change when changing the number of levels of the multi-level data to a lower setting so that the maximum storage capacity becomes smaller.

14. A nonvolatile semiconductor memory device as set forth in claim 1, wherein said multi-level data is binary or trinary level data.

15. A nonvolatile semiconductor memory device as set forth in claim 1, wherein said means for changing the storage capacity changes the storage capacity in accordance with a manual switch.

16. A nonvolatile semiconductor memory device as set forth in claim 15, wherein said manual switch is a mechanical switch.

17. A nonvolatile semiconductor memory device as set forth in claim 15, wherein said manual switch is an electrical switch.

18. A nonvolatile semiconductor memory device as set forth in claim 1, wherein said means for changing the storage capacity changes the storage capacity in accordance with a physical characteristic of said memory device.

19. A nonvolatile semiconductor memory device as set forth in claim 18, wherein said physical characteristic is a hole.

20. A nonvolatile semiconductor memory device as set forth in claim 18, wherein said physical characteristic is a notch.

21. An IC memory card as set forth in claim 8, wherein said multi-level data is binary or trinary level data.

22. An IC memory card as set forth in claim 8, wherein said means for changing the storage capacity changes the storage capacity in accordance with a manual switch.

23. An IC memory card as set forth in claim 22, wherein said manual switch is a mechanical switch.

24. An IC memory card as set forth in claim 22, wherein said manual switch is an electrical switch.

25. An IC memory card as set forth in claim 8, wherein the means for changing the storage capacity changes the storage capacity in accordance with a physical characteristic of said memory device.

26. An IC memory card as set forth in claim 25, wherein said physical characteristic is a hole.

27. An IC memory card as set forth in claim 25, wherein said physical characteristic is a notch.

* * * * *